United States Patent [19]

Ono

[11] Patent Number: 5,737,351
[45] Date of Patent: Apr. 7, 1998

[54] SEMICONDUCTOR LASER INCLUDING RIDGE STRUCTURE EXTENDING BETWEEN WINDOW REGIONS

[75] Inventor: Kenichi Ono, Tokyo, Japan

[73] Assignee: Mitsubishi Denki Kabushiki Kaisha, Tokyo, Japan

[21] Appl. No.: 660,179

[22] Filed: Jun. 3, 1996

[30] Foreign Application Priority Data

Nov. 16, 1995 [JP] Japan ................................. 7-298116

[51] Int. Cl.⁶ ................................................. H01S 3/19
[52] U.S. Cl. ................................................. 372/45; 372/46
[58] Field of Search ................................. 372/45, 46

[56] References Cited

U.S. PATENT DOCUMENTS

| | | | |
|---|---|---|---|
| 5,020,067 | 5/1991 | Okada | 372/45 |
| 5,020,068 | 5/1991 | Isshiki | 372/45 |
| 5,151,913 | 9/1992 | Ueno | 372/45 |
| 5,343,486 | 8/1994 | Itaya et al. | 372/46 |
| 5,469,457 | 11/1995 | Nagai et al. | 372/45 |

FOREIGN PATENT DOCUMENTS

3208388  9/1991  Japan.

*Primary Examiner*—Brian Healy
*Assistant Examiner*—Luong-Quyen T. Phan
*Attorney, Agent, or Firm*—Leydig, Voit & Mayer, Ltd.

[57]  ABSTRACT

A method of fabricating a semiconductor laser includes successively growing a lower cladding layer of a first conductivity type, an active layer having a superlattice structure, a first upper cladding layer of a second conductivity type, an etch stopping layer of the second conductivity type, and a second upper cladding layer of the second conductivity type on a semiconductor substrate of the first conductivity type; diffusing a dopant impurity into parallel stripe-shaped regions of the active layer to disorder the superlattice structure of the active layer in these regions; etching the second upper cladding layer to expose the etch stopping layer without exposing the etch stopping layer on the disordered regions, thereby producing a stripe-shaped ridge structure extending perpendicular to the disordered regions; and growing a current blocking layer on the etch stopping layer and on the disordered regions, contacting both sides of the ridge structure. Since an etchant used for patterning does not contact the etch stopping layer on the disordered regions of the active layer, unwanted penetration of the etch stopping layer is avoided.

6 Claims, 6 Drawing Sheets

Prior Art

SEMICONDUCTOR LASER INCLUDING RIDGE STRUCTURE EXTENDING BETWEEN WINDOW REGIONS

FIELD OF THE INVENTION

The present invention relates to a semiconductor laser having a window structure at facets and a method of fabricating the semiconductor laser with improved yield.

BACKGROUND OF THE INVENTION

In recent years, an increase in power output has been demanded in semiconductor lasers used as light sources for information processing devices, such as optical disks. The power output of semiconductor lasers can be increased by providing window structures at resonator facets to increase the output level at which COD (Catastrophic Optical Damage) occurs. In a semiconductor laser, COD occurs suddenly when the light output of the laser exceeds a critical level. More specifically, because of localized increase in the temperature of the laser at the facets, the band gap energy is reduced at the facets. The reduction in the band gap energy results in increased light absorption there, and the light absorption, in turn, increases the temperature at the facets. If the temperature rise is sufficient, localized melting of the semiconductor materials can occur, resulting in COD that destroys the laser.

The window structures increase the band gap energy of the active layer at the resonator facets and prevent the COD at the facets. For example, Japanese Published Patent Application No. Hei. 3-208388 discloses an AlGaInP semiconductor laser including window structures at resonator facets. In this prior art, the window structures are produced by diffusing a dopant impurity into regions of an active layer in the vicinity of the resonator facets to disorder a natural superlattice structure of the active layer in these regions.

Figure 4:
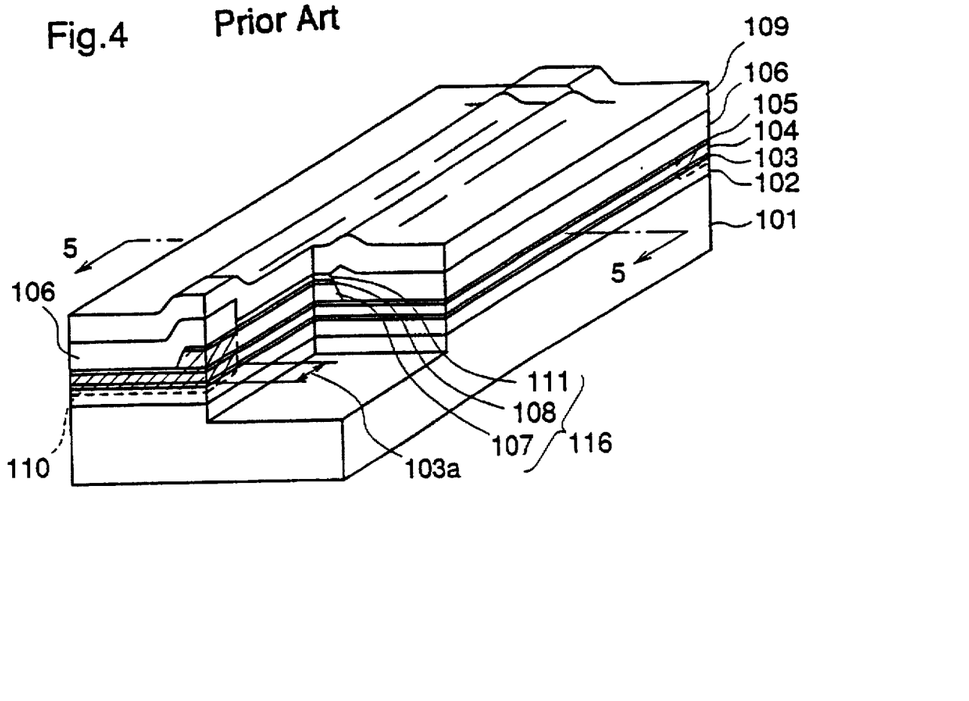
FIG. 4 is a perspective view, partly broken away, illustrating a high-output AlGaInP series semiconductor laser according to the prior art.
Figure 5:
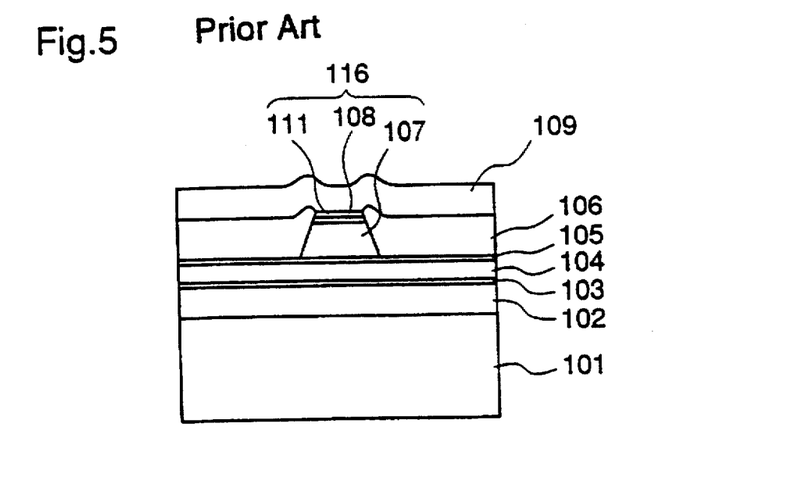
FIG. 5 is a cross-sectional view taken along a line 5—5 in FIG. 4.

FIG. 4 is a perspective view, partly broken away, illustrating a high-output AlGaInP series semiconductor laser similar to the prior art semiconductor laser disclosed in the publication. FIG. 5 is a cross-sectional view of the semiconductor laser taken along a line 5—5 in FIG. 4. In these figures, reference numeral 101 designates an n type GaAs substrate. An n type AlGaInP lower cladding layer 102 1~2 µm thick is disposed on the n type GaAs substrate 101. An active layer 103 comprising GaInP having a natural superlattice structure and having a thickness of several hundreds of angstroms is disposed on the n type lower cladding layer 102. A p type AlGaInP first upper cladding layer 104 0.1~1 µm thick is disposed on the active layer 103. A p type GaInP etch stopping layer 105 having a thickness of several tens of angstroms is disposed on the first upper cladding layer 104. A p type AlGaInP second upper cladding layer 107 1~2 µm thick is disposed on a part of the etch stopping layer 105. A p type GaInP band discontinuity reduction layer 108 having a thickness in a range from 0.1 micron to several microns is disposed on the second upper cladding layer 107. A p type GaAs cap layer 111 0.1~1 µm thick is disposed on the band discontinuity reduction layer 108. The second upper cladding layer 107, the band discontinuity reduction layer 108, and the cap layer 111 form a stripe-shaped ridge structure 116 which extends in a direction perpendicular to resonator facets of the laser. N type GaAs current blocking layers 106 are disposed on the etch stopping layer 105, contacting both sides of the ridge structure 116. A p type GaAs ohmic contact layer 109 is disposed on the cap layer 111 and on the current blocking layers 106. The laser structure has impurity-diffused regions 110 at the resonator facets. Reference numeral 103a designates a window structure. An n side electrode is disposed on the rear surface of the n type substrate 101 and a p side electrode is disposed on the surface of the p type ohmic contact layer 109 although these electrodes are not shown in FIGS. 4 and 5.

FIGS. 6(a)–6(h) are perspective views illustrating process steps in a method of fabricating the semiconductor laser shown in FIGS. 4 and 5. In the figures, the same reference numerals as those shown in FIGS. 4 and 5 designate the same or corresponding parts. Reference numeral 112 designates an SiN film. Other insulating films may be used in place of the SiN film. Reference numeral 113 designates a ZnO film. Reference numeral 114 designates an $SiO_2$ film. Other insulating films may be used in place of the $SiO_2$ film. Reference numeral 115 designates an organic resist film.

A description is given of the fabrication process.

Figure 6:
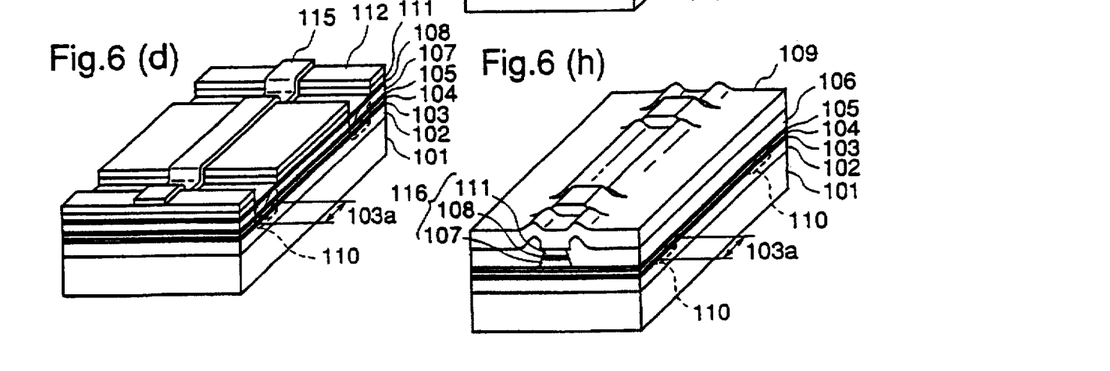
FIGS. 6(a)–6(h) are perspective views illustrating process steps in a method of fabricating the semiconductor laser shown in FIGS. 4 and 5.

Initially, as illustrated in FIG. 6(a), there are successively grown on the n type GaAs substrate 101, the n type AlGaInP lower cladding layer 102, the GaInP active layer 103, the p type AlGaInP first upper cladding layer 104, the p type GaInP etch stopping layer 105, the p type AlGaInP second upper cladding layer 107, the p type GaInP band discontinuity reduction layer 108, and the p type GaAs cap layer 111, producing a semiconductor laminated structure. Preferably, these layers are grown by MOCVD (Metal Organic Chemical Vapor Deposition). In this growth, a natural superlattice structure is produced in the active layer 103.

Next, an SiN film 112 is deposited on the semiconductor laminated structure by plasma CVD and patterned by dry etching to form parallel stripe-shaped openings, each having a width of several tens of microns. Then, portions of the GaAs cap layer 111 are wet-etched through the openings (FIG. 6(b)). Thereafter, a ZnO film 113 and an $SiO_2$ film 114 are deposited on the semiconductor laminated structure by sputtering, followed by annealing to diffuse Zn from the ZnO film 113 into part of the semiconductor laminated structure beneath the openings of the SiN film 112, from the p type band discontinuity reduction layer 108 to the n type lower cladding layer 102 (FIG. 6(c)). This solid-phase diffusion produces stripe-shaped impurity-diffused regions 110, and the natural superlattice structure of the active layer 103 in the impurity-diffused regions 110 is disordered. The band gap energy of the active layer 103 is larger in the disordered regions than in regions that are not disordered. The disordered regions of the active layer 103 are window structures 103a.

After removal of the $SiO_2$ film 114 and the ZnO film 113, a stripe-shaped organic resist film 115 extending in the direction perpendicular to the impurity-diffused regions 110 is formed on the semiconductor laminated structure using a stripe transfer technique (FIG. 6(d)). Using the organic resist film 115 as a mask, initially, the SiN film 112 is patterned in a stripe and, subsequently, the p type GaAs cap layer 111 is etched with a mixture of ammonia and hydrogen peroxide, forming a ridge comprising the cap layer. Further, using the same mask, the GaInP band discontinuity reduction layer 108 is etched with a hydrochloric acid based etchant, such as a mixture of HCl and water (=1:1), forming a ridge comprising the band discontinuity reduction layer (FIG. 6(e)). After removal of the organic resist film 115, the p type AlGaInP second upper cladding layer 107 is etched and removed with a sulfuric acid based etchant, such as a mixture of sulfuric acid and water (=1:1), until the surface of the p type GaInP etch stopping layer 105 is exposed, thereby completing a ridge structure 116 comprising the p type cap layer 111, p type band discontinuity reduction layer 108, and the second upper cladding layer 107 (FIG. 6(f)). Since the etching rate of the p type GaInP etch stopping layer 105 by the sulfuric acid based etchant is lower than the etching rate of the p type AlGaInP second upper cladding layer 107 by the same etchant, etching of the cladding layer 107 in the direction perpendicular to the surface of the substrate 101 can be stopped at the etch stopping layer 105.

Thereafter, the n type current blocking layer 106 is grown on the etch stopping layer 105, contacting both sides of the ridge structure 116, preferably by MOCVD (FIG. 6(g)). Since the SiN film 112 is disposed on the ridge structure 116, the current blocking layer 106 does not grow on the ridge structure 116.

After removal of the SiN film 112, the p type ohmic contact layer 109 is grown on the current blocking layer 106 and on the ridge structure 116 by MOCVD (FIG. 6(h)). Thereafter, an n side electrode (not shown) and a p side electrode (not shown) are formed on the rear surface of the substrate 101 and the ohmic contact layer 109, respectively. Finally, the structure is cleaved in the impurity-diffused regions 110 in the direction perpendicular to the ridge structure 116 to produce resonator facets, thereby completing a semiconductor laser with window structures 103a as shown in FIG. 4.

In the prior art method of fabricating a semiconductor laser with window structures, when the ridge structure 116 is formed by etching the p type AlGaInP second upper cladding layer 107 (FIG. 6(f)), since the etching rate of the GaInP etch stopping layer 105 in the Zn-diffused region 110 is different from the etching rate of that layer in region free of diffused Zn, the etching does not accurately stop at the etch stopping layer 105 in the Zn-diffused region 110. Thus, the etch stopping layer 105 is etched through and the first upper cladding layer 104 and the active layer 103 are unfavorably etched. If the first upper cladding layer 104 and the active layer 103 in the Zn-diffused region 110 are etched and removed, when the ridge structure 116 is buried with the n type GaAs current blocking layer 106, the current blocking layer 106 undesirably contacts the window structure 103a in the active layer 103. In this case, laser light traveling through the active layer 103 is absorbed in the current blocking layer 106 contacting the window structure 103a, whereby high-power output operation of the laser is not realized. Further, since the window structure 103a of the active layer 103 is exposed to the atmosphere when the current blocking layer 106 is grown, crystalline quality is degraded at the exposed surface. As a result, a semiconductor laser with desired characteristics cannot be obtained.

In order to avoid these problems, the etching of the second upper cladding layer 107 may be controlled by controlling the etching time so that the first upper cladding layer 104 and the active layer 103 are not etched. However, since the conventional etchant used for etching of the band discontinuity reduction layer 108 does not provide a high etching rate of the band discontinuity reduction layer 108 relative to the etching rate of the p type AlGaInP second upper cladding layer 107 by this etchant, the second upper cladding layer 107 is unfavorably etched when the band discontinuity reduction layer 108 is etched. So, it is difficult to determine, accurately, the amount of etching of the second upper cladding layer 107 based on the duration of etching of the band discontinuity reduction layer 108, and the thickness of the remaining second upper cladding layer 107 cannot be known accurately. Therefore, when the second upper cladding layer 107 is etched in a subsequent process, accurate control of the etching based on the etching time is difficult. Since the etching of the second upper cladding layer 107 is not controlled accurately, it is difficult to avoid penetration of the etch stopping layer 105 in the Zn-diffused region 110.

SUMMARY OF THE INVENTION

It is an object of the present invention to provide a method of fabricating a semiconductor laser having window structures with a good yield.

It is another object of the present invention to provide a semiconductor laser having window structures that can be fabricated with a good yield.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a semiconductor laser comprises preparing a semiconductor substrate of a first conductivity type; successively growing a lower cladding layer of a first conductivity type, an active layer having a superlattice structure, a first upper cladding layer of a second conductivity type, opposite the first conductivity type, an etch stopping layer of the second conductivity type, and a second upper cladding layer of the second conductivity type on the semiconductor substrate; diffusing a dopant impurity into parallel stripe-shaped regions of the active layer to disorder the superlattice structure of the active layer in these regions; etching the second upper cladding layer until the etch stopping layer is exposed so that part of the etch stopping layer on the disordered regions are not exposed, thereby producing a stripe-shaped ridge structure comprising the second upper cladding layer and extending in a direction perpendicular to the disordered regions; and growing a current blocking layer on the exposed surface of the etch stopping layer and on the disordered regions, contacting both sides of the ridge structure. In this method, when the ridge structure is formed by patterning the second upper cladding layer, since an etchant used for the patterning does not contact the etch stopping layer on the disordered regions of the active layer which become window structures, unwanted breaking of the etch stopping layer whose etching rate is increased due to the impurity diffusion, by the etchant is avoided. As a result, a semiconductor laser with window structures, having desired characteristics and producing high-power output, is fabricated at a good yield.

According to a second aspect of the present invention, the method further includes successively growing a band discontinuity reduction layer of the second conductivity type and a cap layer of the second conductivity type on the second upper cladding layer; forming parallel stripe-shaped openings in the cap layer to expose the surface of the band discontinuity reduction layer in the openings; diffusing the dopant impurity from the exposed surface of the band discontinuity reduction layer into the active layer, through the two openings of the cap layer, to produce the disordered regions in the active layer; forming a resist film on the exposed surface of the band discontinuity reduction layer; patterning the cap layer and the band discontinuity reduction layer in a region other than the region where the resist film is present to form a stripe-shaped ridge extending in the direction perpendicular to the disordered regions; after removal of the resist film, patterning the second upper cladding layer with an etchant that etches the second upper cladding layer at a relatively high rate and etches the band discontinuity reduction layer at a relatively low rate, leaving portions under the disordered regions and under the stripe-shaped band discontinuity reduction layer. In this method, when the ridge structure is formed by etching the second upper cladding layer, since the band discontinuity reduction layer having an etching rate by the etchant lower than that of the second upper cladding layer is present on the disordered regions of the active layer which become window structures, the second upper cladding layer remains on the disordered regions by the time the ridge structure is completed, so that the etchant does not contact the etch stopping layer on the disordered regions. Therefore, the ridge structure is produced with no breaking of the etch stopping layer whose etching rate is increased due to the impurity diffusion. As a result, a semiconductor laser with window structures, having desired characteristics and producing high-power output, is fabricated at a good yield.

According to a third aspect of the present invention, a semiconductor laser comprises opposed resonator facets; a semiconductor substrate of a first conductivity type; a lower cladding layer of the first conductivity type disposed on the semiconductor substrate; an active layer having a superlattice structure and disposed on the lower cladding layer, the superlattice structure being disordered by diffusion of a dopant impurity at portions in the vicinity of the resonator facets; a first upper cladding layer of a second conductivity type, opposite the first conductivity type, disposed on the active layer; an etch stopping layer of the second conductivity type disposed on the first upper cladding layer; a second upper cladding layer of the second conductivity type, disposed on part of the etch stopping layer in the vicinity of the resonator facets and on a stripe-shaped part of the etch stopping layer, the stripe-shaped part having a prescribed width and extending in a direction perpendicular to the resonator facets, the second upper cladding layer on the stripe-shaped part of the etch stopping layer having the shape of a ridge; and a current blocking layer burying the ridge of the second upper cladding layer.

DETAILED DESCRIPTION OF THE PREFERRED EMBODIMENTS

Figure 1:
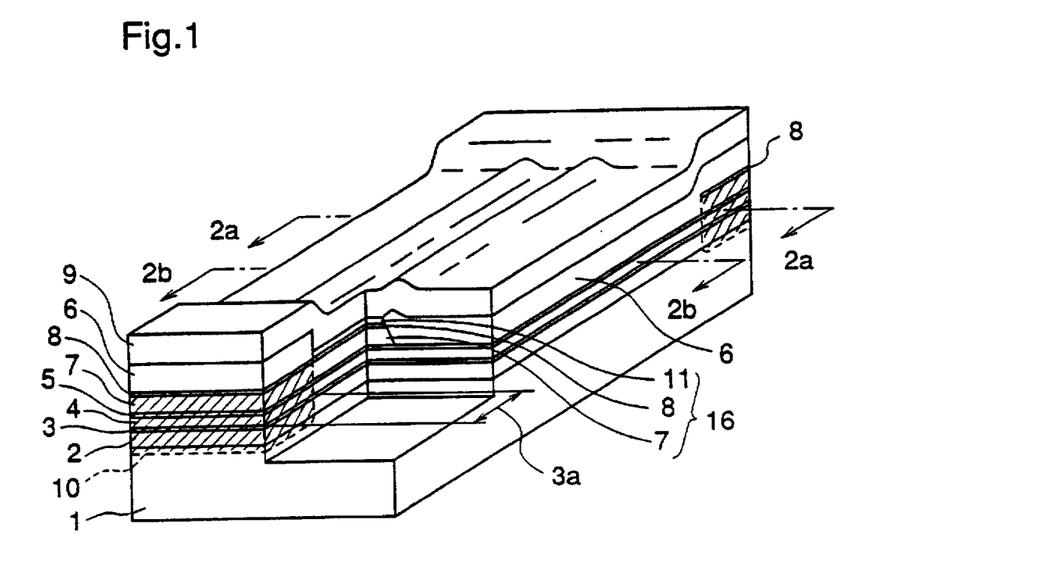
FIG. 1 is a perspective view, partly broken away, illustrating a semiconductor laser according to an embodiment of the present invention.
Figure 2:
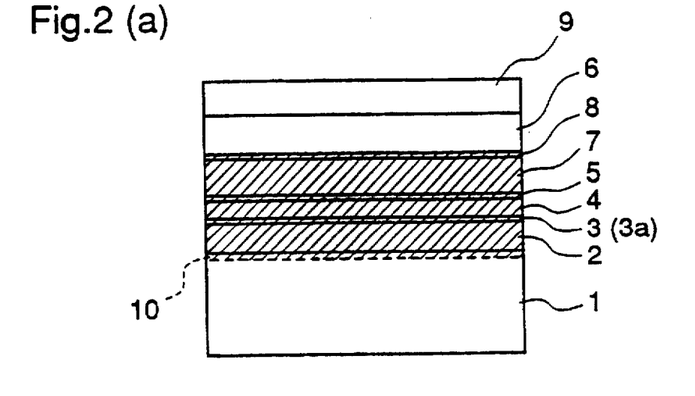
FIGS. 2(a) and 2(b) are cross-sectional views taken along lines 2a—2a and 2b—2b in FIG. 1, respectively.

FIG. 1 is a perspective view, partly broken away, illustrating a semiconductor laser according to an embodiment of the present invention. FIGS. 2(a) and 2(b) are cross-sectional views taken along lines 2a—2a and 2b—2b in FIG. 1, respectively.

In these figures, reference numeral 1 designates an n type GaAs substrate. An n type AlGaInP lower cladding layer 2 having a thickness of 1~2 μm and an Al composition of 0.7 is disposed on the n type GaAs substrate 1. An active layer 3 comprising GaInP having a natural superlattice structure and having a thickness of several hundreds of angstroms is disposed on the n type lower cladding layer 2. A p type AlGaInP first upper cladding layer 4 having a thickness of 0.1~1 μm and an Al composition of 0.7 is disposed on the active layer 3. A p type GaInP etch stopping layer 5 having a thickness of several tens of angstroms is disposed on the first upper cladding layer 4. A p type AlGaInP second upper cladding layer 7 having a thickness of 1~2 μm and an Al composition of 0.7 is disposed on a part of the etch stopping layer 5. A p type GaInP band discontinuity reduction layer 8 having a thickness in a range from 0.1 micron to several microns is disposed on the p type second upper cladding layer 7. A p type GaAs cap layer 11 0.1~1 μm thick is disposed on the band discontinuity reduction layer 8. The second upper cladding layer 7, the band discontinuity reduction layer 8, and the cap layer 11 form a stripe-shaped ridge structure 16 which extends in a direction perpendicular to resonator facets of the laser. N type GaAs current blocking layers 6 are disposed on the etch stopping layer 5, contacting both sides of the ridge structure 16. A p type GaAs ohmic contact layer 9 is disposed on the cap layer 11 and on the current blocking layers 6. The laser structure has impurity-diffused regions 10 at the resonator facets. Reference numeral 3a designates a window structure. An n side electrode is disposed on the rear surface of the n type substrate 1 and a p side electrode is disposed on the surface of the p type ohmic contact layer 9 although these electrodes are not shown in the figures.

FIGS. 3(a)–3(h) are perspective views illustrating process steps in a method of fabricating the semiconductor laser according to an embodiment of the present invention. In the figures, the same reference numerals as those shown in FIG. 1 designate the same or corresponding parts. Reference numeral 12 designates an SiN film. Other insulating films may be used in place of the SiN film. Reference numeral 13 designates a ZnO film. Reference numeral 14 designates an SiO$_2$ film. Other insulating films may be used in place of the SiO$_2$ film. Reference numerals 15 and 15a designate organic resist films.

A description is given of the fabrication process.

Figure 3:
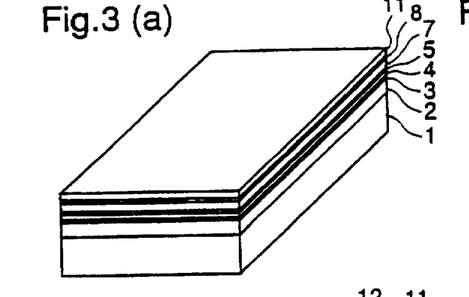
FIGS. 3(a)–3(h) are perspective views illustrating process steps in a method of fabricating the semiconductor laser according to the embodiment of the present invention.

Initially, as illustrated in FIG. 3(a), there are successively grown on the n type GaAs substrate 1, the n type AlGaInP lower cladding layer 2, the GaInP active layer 3, the p type AlGaInP first upper cladding layer 4, the p type GaInP etch stopping layer 5, the p type AlGaInP second upper cladding layer 7, the p type GaInP band discontinuity reduction layer 8, and the p type GaAs cap layer 11, producing a semiconductor laminated structure. Preferably, these layers are grown by MOCVD (Metal Organic Chemical Vapor Deposition) or MBE (Molecular Beam Epitaxy). In this growth, a natural superlattice structure is produced in the active layer 3.

Next, an SiN film 12 is deposited on the semiconductor laminated structure by plasma CVD and patterned by dry etching to form parallel stripe-shaped openings, each having a width of several tens of microns. Then, portions of the GaAs cap layer 11 are wet-etched through the openings (FIG. 3(b)). Thereafter, a ZnO film 13 and an SiO$_2$ film 14 are deposited over the semiconductor laminated structure by sputtering, followed by annealing to diffuse Zn from the ZnO film 13 into part of the semiconductor laminated structure beneath the openings of the SiN film 12 (FIG. 3(c)). The concentration of this solid-phase diffusion is in a range from $1 \times 10^{18}$ cm$^{-3}$ to $1 \times 10^{19}$ cm$^{-3}$. In this embodiment of the invention, Zn is diffused to a depth reaching the substrate 1. This solid-phase diffusion produces stripe-shaped impurity-diffused regions 10, and the natural superlattice structure of the active layer 3 in the impurity-diffused regions 10 is disordered. The band gap energy of the active layer 3 is larger in the disordered regions than in regions that are not disordered. The disordered regions of the active layer 3 are window structures 3a. In place of Zn, silicon (Si) may be used as an impurity for the solid-phase diffusion. In place of the solid-phase diffusion, a vapor-phase diffusion or a combination of ion implantation and annealing may be employed.

After removal of the $SiO_2$ film 14 and the ZnO film 13, using a stripe transfer technique, an organic resist film 15 is formed on a stripe region of the semiconductor laminated structure extending in the direction perpendicular to the impurity-diffused regions 10 and on portions of the band discontinuity reduction layer 8 exposed in the openings of the SiN film 12 (FIG. 3(d)).

Using the organic resist film 15 as a mask, the SiN film 12 is patterned into a stripe. Thereafter, using the SiN film 12 as a mask, the p type GaAs cap layer 11 is etched with a mixture of ammonia ($NH_4OH$) and hydrogen peroxide ($H_2O_2$) (=1:20) and, subsequently, the GaInP band discontinuity reduction layer 8 is etched with a hydrochloric acid based etchant, such as a mixture of HCl and water (=1:1) (FIG. 3(e)). After removal of the organic resist film 15, the p type AlGaInP second upper cladding layer 7 is etched with a sulfuric acid based etchant, such as a mixture of sulfuric acid and water (=1:1), until the surface of the p type GaInP etch stopping layer 5 is exposed, thereby completing a stripe-shaped ridge structure 16 comprising the p type cap layer 11, p type band discontinuity reduction layer 8, and the second upper cladding layer 7 (FIG. 3(f)). Since the etching rate of the p type GaInP etch stopping layer 5 is lower than the etching rate of the p type AlGaInP second upper cladding layer 7, the etching of the cladding layer 7 in the direction perpendicular to the surface of the substrate 1 can be stopped at the etch stopping layer 5.

Figure 7:
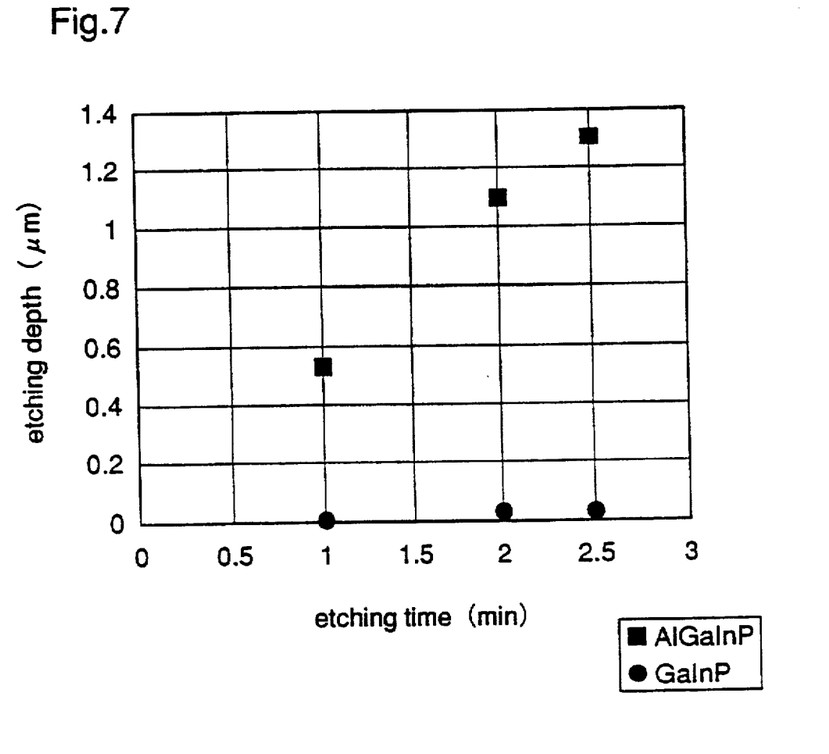
FIG. 7 is a graph illustrating etching depth vs. etching time characteristics of a sulfuric acid based etchant used in the fabrication method of the semiconductor laser according to an embodiment of the present invention.

The sulfuric acid based etchant employed for the etching of the p type AlGaInP second upper cladding layer 7 etches AlGaInP at a high rate, but the etching rate of GaInP by this etchant is very low. FIG. 7 shows etching depth vs. etching time characteristics of AlGaInP and GaInP for a mixture of sulfuric acid and water (=1:1). As shown in FIG. 7, the etching rate of AlGaInP in this etchant is 520 nm/min while the etching rate of GaInP in this etchant is 9 nm/min, and this means that the etching rate of GaInP by this etchant is very low. The GaInP band discontinuity reduction layer 8 remains on the impurity-diffused regions 10 when the etching of the p type AlGaInP second upper cladding layer 7 is started, and the etching rate of the GaInP band discontinuity reduction layer 8 is very low. Therefore, by the time the p type AlGaInP second upper cladding layer 7 in a region other than the impurity-diffused regions 10 is etched and the etch stopping layer 5 is exposed, i.e., by the time the ridge structure 16 is completed, the band discontinuity reduction layer 8 and the p type AlGaInP second upper cladding layer 7 in the impurity-diffused regions 10 are not completely removed but remain on the etch stopping layer 5 in the shape of a ridge. As a result, the etch stopping layer 5 in the impurity-diffused regions 10 is not etched. The band discontinuity reduction layer 8 in the impurity-diffused regions 10 is sometimes completely removed by the time the ridge structure 16 is completed. Whether or not the band discontinuity reduction layer 8 remains depends on the thickness of this layer and the etching time to form the ridge structure 16.

Thereafter, the n type current blocking layer 6 is grown by MOCVD to bury the ridge structure 16 (FIG. 3(g)). Since the SiN film 12 is present on the ridge structure 16, the current blocking layer 6 is not grown on the ridge structure 16. Since the SiN film 12 is not present on the band discontinuity reduction layer 8 and the p type AlGaInP second upper cladding layer 7 in the impurity-diffused regions 10, the current blocking layer 6 is grown on these layers in the impurity-diffused regions 10.

After removal of the SiN film 12, the p type ohmic contact layer 9 is grown on the current blocking layer 6 and on the ridge structure 16 by MOCVD (FIG. 3(h)). Thereafter, an n side electrode (not shown) and a p side electrode (not shown) are formed on the rear surface of the substrate 1 and the ohmic contact layer 9, respectively. Finally, the structure is cleaved in the impurity-diffused regions 10 in the direction perpendicular to the ridge structure 16 to produce resonator facets, thereby completing a semiconductor laser with window structures 3a as shown in FIG. 1.

A description is given of the operation. When a forward bias voltage is applied across the p side electrode and the n side electrode, holes are injected into the active layer 3 beneath the ridge structure 16 from the p side electrode through the p type ohmic contact layer 9, the p type cap layer 11, the p type band discontinuity reduction layer 8, the second upper cladding layer 7, the p type etch stopping layer 5, and the p type first upper cladding layer 4, and electrons are injected into the active layer 3 from the n side electrode through the n type substrate 1 and the n type lower cladding layer 2. In the active layer 3, holes and electrons recombine to produce light. When the current applied to the laser is increased and the light produced in the active layer exceeds the optical loss in the waveguide, laser oscillation occurs between the resonator facets, and laser light is emitted from the facets.

In the semiconductor laser according to the present invention, the active layer 3 comprises GaInP having a natural superlattice structure. Since parts of the active layer 3 in the vicinity of the resonator facets of the laser are within the impurity-diffused regions 10, the natural superlattice structure of the active layer in the impurity-diffused regions 10 is disordered, so that the band gap energy of the active layer 3 is larger in the disordered regions 10 than in other regions that are not disordered. Therefore, the active layer 3 in the disordered regions 10 provides window structures 3a that reduce absorption of light near the resonator facets, thereby increasing the power output of the semiconductor laser without risking COD.

In the fabrication process of the semiconductor laser according to the present invention, as shown in FIG. 3(d), the organic resist film 15 is formed not only on the stripe region of the semiconductor laminated structure where the ridge structure 16 is later produced but also on the band discontinuity reduction layer 8 in the impurity-diffused regions 10. Using the organic resist film 15 as a mask, the SiN film 12, the cap layer 11, and the band discontinuity reduction layer 8 are etched without etching the band discontinuity reduction layer 8 in the impurity-diffused regions 10. After removal of the organic resist film 15, using the SiN film 12 as a mask, the structure is etched with a sulfuric acid based etchant that etches the p type AlGaInP second upper cladding layer 7 at a relatively high rate and etches the p type GaInP band discontinuity reduction layer 8 at a relatively low rate, whereby the ridge structure 16 is completed before the band discontinuity reduction layer 8 and the second upper cladding layer 7 in the impurity-diffused regions 10 are completely etched and removed. In the formation of the ridge structure 16, when the second upper cladding layer 7 is etched, the etchant does not contact the etch stopping layer 5 in the impurity-diffused regions 10, so that the etch stopping layer 5 in the impurity-diffused regions 10, i.e., on the window structures 3a, is not etched. Therefore, unwanted penetration of the etch stopping layer 5 in the impurity-diffused regions 10 during the formation of the ridge structure 16, which occurs in the prior art fabrication process, can be avoided. As a result, a semiconductor laser with window structures that has desired characteristics and produces high-power output is fabricated at a good yield.

In the specific embodiment of the present invention, a GaInP layer having a natural superlattice structure is employed as the active layer 3. However, the present invention may be applied to semiconductor lasers including active layers that comprise other materials having natural superlattice structures, such as an AlGaInP active layer having a natural superlattice structure, or active layers having other superlattice structures, such as an MQW (Multiple Quantum Well) active layer comprising, alternatingly laminated, GaInP well layers and $(Al_{0.5}Ga_{0.5})_{0.5}In_{0.5}P$ barrier layers, or an MQW active layer comprising, alternatingly laminated, two kinds of AlGaInP layers having different Al compositions.

In the specific embodiment of the present invention, emphasis has been placed upon a semiconductor laser in which a GaAs current blocking layer is employed and light produced in an active layer is absorbed by the current blocking layer to confine and guide the light. However, the present invention may be applied to semiconductor lasers having other current blocking structures. For example, the present invention can be applied to a semiconductor laser in which a material having a refractive index smaller than that of a semiconductor material constituting a ridge structure is employed for a current blocking layer to produce a difference in refractive indices between a part of an active layer beneath the ridge structure and a part of the active layer beneath the current blocking layer, and light produced in the active layer is confined utilizing this difference in refractive indices.

Although in the specific embodiment of the invention a semiconductor laser comprising AlGaInP series materials is employed, the present invention may be applied to semiconductor lasers comprising AlGaAs or InGaAsP series materials.

Furthermore, although in the specific embodiment of the invention a semiconductor laser including an n type substrate is described, the present invention may be applied to a semiconductor laser including a p type substrate.

What is claimed is:

1. A semiconductor laser comprising:

opposed resonator facets;

a semiconductor substrate of a first conductivity type;

a lower cladding layer of the first conductivity type, disposed on the semiconductor substrate;

an active layer having a superlattice structure and disposed on the lower cladding layer, the superlattice structure being disordered in respective window regions adjacent each of the resonator facets;

a first upper cladding layer of a second conductivity type, opposite the first conductivity type, disposed on the active layer;

an etch stopping layer of the second conductivity type, disposed on the first upper cladding layer;

a second upper cladding layer of the second conductivity type, disposed on the etch stopping layer, the laser including a ridge structure disposed on the etch stopping layer and comprising part of the second upper cladding layer, the ridge structure having a width narrower than the resonator facets and extending in a direction perpendicular to the resonator facets, between the window regions; and a current blocking layer contacting opposite sides of the ridge structure between the window regions, the second upper cladding layer and the current blocking layer being coextensive in width with the resonator facets in the window regions.

2. The semiconductor laser of claim 1 including a band discontinuity reduction layer of the second conductivity type disposed on the second upper cladding layer and a cap layer of the second conductivity type disposed on the band discontinuity reduction layer.

3. The semiconductor laser of claim 2 wherein:

the semiconductor substrate comprises GaAs;

the lower cladding layer comprises AlGaInP;

the first and second upper cladding layers comprise AlGaInP;

the etch stopping layer comprises GaInP;

the band discontinuity reduction layer comprises GaInP; and the cap layer comprises GaAs and wherein the active layer is selected from the group consisting of a single GaInP layer having a natural superlattice structure, a single AlGaInP layer having a natural superlattice structure, a layer having a multiquantum well structure in which GaInP layers and AlGaInP layers are alternatingly laminated, and a layer having a multiquantum well structure in which two kinds of AlGaInP layers having different Al compositions are alternatingly laminated.

4. The semiconductor laser of claim 2 wherein the ridge structure includes the cap layer and part of the band discontinuity reduction layer.

5. The semiconductor laser of claim 4 wherein the cap layer is not present in the window regions.

6. The semiconductor laser of claim 2 wherein the cap layer is not present in the window regions.

* * * * *